(12) United States Patent
Behringer et al.

(10) Patent No.: US 11,296,265 B2
(45) Date of Patent: Apr. 5, 2022

(54) RADIATION-EMITTING SEMICONDUCTOR DEVICE AND FABRIC

(71) Applicant: OSRAM Opto Semiconductors GmbH, Regensburg (DE)

(72) Inventors: Martin Rudolf Behringer, Regensburg (DE); Alexander F. Pfeuffer, Regensburg (DE); Andreas Plößl, Regensburg (DE); Georg Bogner, Lappersdorf (DE); Berthold Hahn, Hemau (DE); Frank Singer, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 84 days.

(21) Appl. No.: 16/606,538

(22) PCT Filed: Apr. 18, 2018

(86) PCT No.: PCT/EP2018/059921
§ 371 (c)(1),
(2) Date: Oct. 18, 2019

(87) PCT Pub. No.: WO2018/192985
PCT Pub. Date: Oct. 25, 2018

(65) Prior Publication Data
US 2020/0127181 A1    Apr. 23, 2020

(30) Foreign Application Priority Data
Apr. 21, 2017  (DE) .......................... 102017108580.7

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/167* (2013.01); *A41D 13/01* (2013.01); *A62B 17/00* (2013.01)

(58) Field of Classification Search
CPC ... H01L 33/62; H01L 25/0753; H01L 25/167; A41D 13/01; A62B 17/00
See application file for complete search history.

(56) References Cited

U.S. PATENT DOCUMENTS 8,783,903 B2* 7/2014 Bhattacharya ......... D03D 11/00
362/235
10,499,502 B2* 12/2019 de Kok ................. H05K 1/038
(Continued)

FOREIGN PATENT DOCUMENTS

DE         102015115722 A1    3/2017

*Primary Examiner* — Shaun M Campbell
(74) *Attorney, Agent, or Firm* — Slater Matsil, LLP

(57) ABSTRACT

A radiation-emitting semiconductor device and a fabric are disclosed. In an embodiment, a radiation-emitting semiconductor device includes a semiconductor layer sequence having an active region configured to generate radiation and at least one carrier on which the semiconductor layer sequence is arranged, wherein the at least one carrier has at least one anchoring structure on a carrier underside facing away from the semiconductor layer sequence, wherein the at least one anchoring structure includes electrical contact points for making electrical contact with the semiconductor layer sequence, and wherein the at least one anchoring structure is configured to receive at least one thread for fastening the semiconductor device to a fabric and for electrical contacting the at least one thread.

20 Claims, 7 Drawing Sheets

(51) Int. Cl.
*H01L 25/16* (2006.01)
*A41D 13/01* (2006.01)
*A62B 17/00* (2006.01)

(56) References Cited

U.S. PATENT DOCUMENTS

| | | | |
|---|---|---|---|
| 2002/0130624 A1* | 9/2002 | Nakamura | D02G 3/441 |
| | | | 315/56 |
| 2003/0211797 A1* | 11/2003 | Hill | H05K 1/189 |
| | | | 442/205 |
| 2004/0009729 A1* | 1/2004 | Hill | D03D 15/258 |
| | | | 442/208 |
| 2008/0200061 A1 | 8/2008 | Lee | |
| 2009/0200066 A1* | 8/2009 | Vicard | H01L 25/0657 |
| | | | 174/255 |
| 2011/0204392 A1 | 8/2011 | Weekamp et al. | |
| 2014/0038325 A1 | 2/2014 | Marutani et al. | |
| 2015/0214197 A1* | 7/2015 | Ohmae | H01L 24/48 |
| | | | 257/88 |
| 2015/0217406 A1* | 8/2015 | Canonico | H05K 3/027 |
| | | | 219/121.69 |
| 2016/0265762 A1 | 9/2016 | Yoshida et al. | |
| 2017/0040306 A1 | 2/2017 | Kim et al. | |
| 2017/0251555 A1* | 8/2017 | Sunshine | H01L 23/3121 |
| 2017/0294417 A1* | 10/2017 | Edmond | H01L 25/0753 |
| 2018/0020541 A1* | 1/2018 | de Kok | H05K 3/365 |
| 2018/0261730 A1 | 9/2018 | Hoeppel et al. | |

* cited by examiner

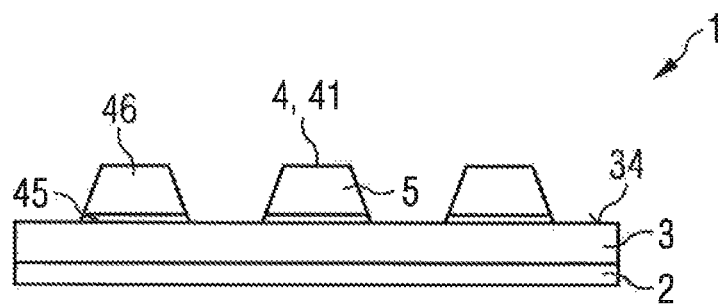
FIG 11A
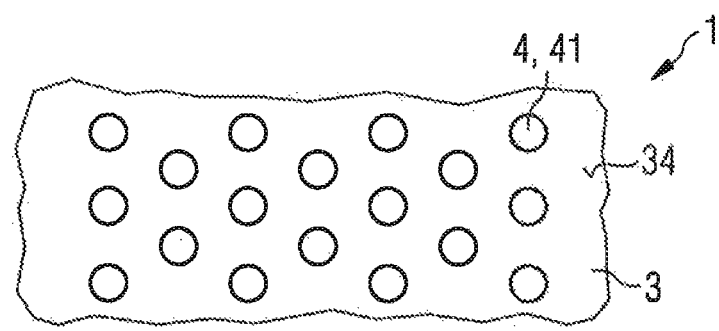
FIG 11B
FIG 12
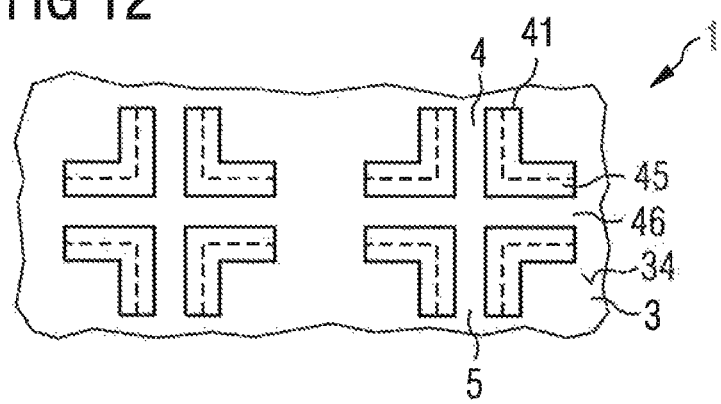
FIG 13
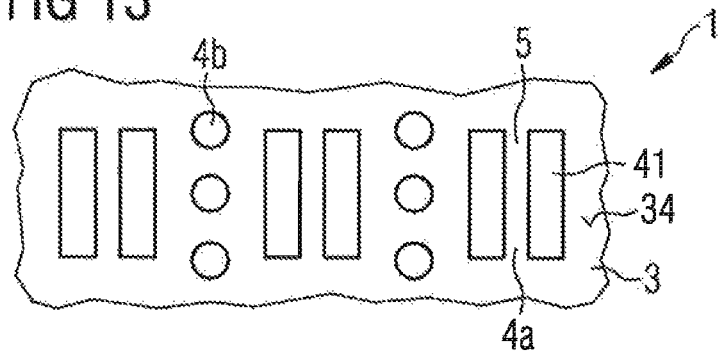

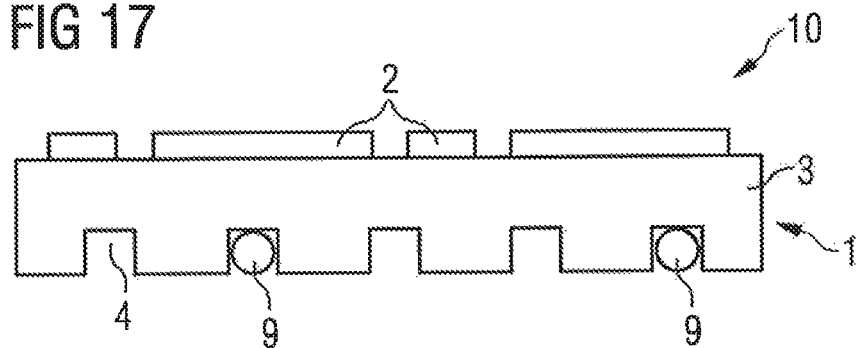
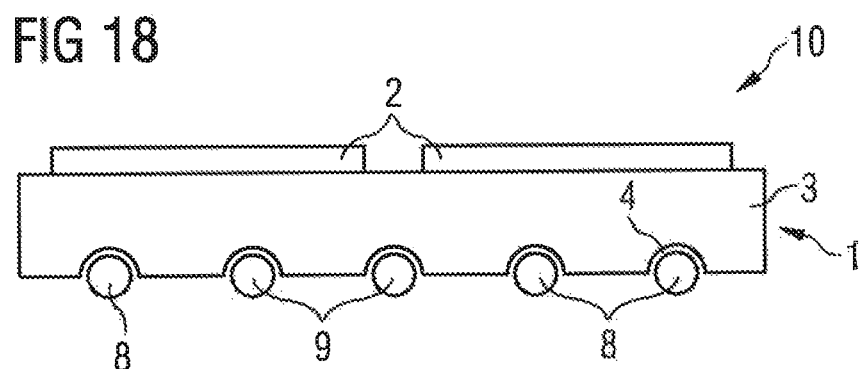
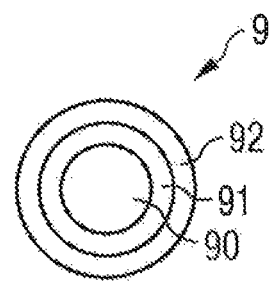
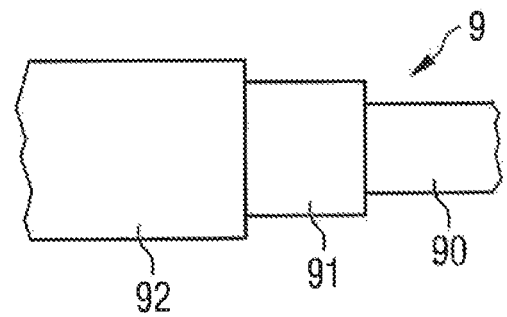

RADIATION-EMITTING SEMICONDUCTOR DEVICE AND FABRIC

This patent application is a national phase filing under section 371 of PCT/EP2018/059921, filed Apr. 18, 2018, which claims the priority of German patent application 102017108580.7, filed Apr. 21, 2017, each of which is incorporated herein by reference in its entirety.

TECHNICAL FIELD

A radiation-emitting semiconductor device is specified. In addition, a fabric is specified.

SUMMARY OF THE INVENTION

Embodiments provide a radiation-emitting semiconductor device that can be efficiently integrated into a fabric.

According to at least one embodiment, the semiconductor device comprises a semiconductor layer sequence. The semiconductor layer sequence contains an active zone for the generation of radiation. For example, the semiconductor layer sequence is designed as a light emitting diode chip, in particular as a thin film light emitting diode chip, in which a growth substrate for the semiconductor layer sequence has been removed. One or more semiconductor layer sequences and thus one or more light emitting diode chips can be present in the semiconductor device.

The radiation to be generated is, for example, near ultraviolet radiation, visible light and/or near infrared radiation. A wavelength of maximum intensity of the radiation generated by the semiconductor layer sequence is preferably at least 360 nm or 420 nm and/or at most 860 nm or 680 nm or 480 nm. For example, the semiconductor layer sequence is configured to emit blue light or green light.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, where in each case $0 \leq n \leq 1$, $0 \leq m \leq 1$ and $n+m \leq 1$ as well as $0 \leq k < 1$ hold. Preferably, $0 < n \leq 0.8$, $0.4 \leq m < 1$ and $n+m \leq 0.95$ and $0 < k \leq 0.5$ apply to at least one layer or to all layers of the semiconductor layer sequence. The semiconductor layer sequence may contain dopants and additional components. For the sake of simplicity, however, only the essential components of the crystal lattice of the semiconductor layer sequence are indicated, i.e., Al, As, Ga, In, N or P, even if these may be partially replaced and/or supplemented by small quantities of other substances.

According to at least one embodiment, the semiconductor device comprises one or more carriers. The at least one semiconductor layer sequence is applied to the at least one carrier. In particular, several light-emitting diode chips, each with one of the semiconductor layer sequences, are mounted on a common carrier. The carrier is preferably the component that mechanically carries and supports the semiconductor device. In this case, the semiconductor device would not be mechanically stable without the carrier.

According to at least one embodiment, the carrier or all carriers or part of the carriers each have at least one anchoring structure. The anchoring structure is located, in particular, on a carrier underside facing away from the semiconductor layer sequence. One or more anchoring structures may be present per carrier. Several of the anchoring structures are preferably present in each carrier.

According to at least one embodiment, the anchoring structure or all of the anchoring structures or a part of the anchoring structures comprise electrical contact points for electrical contacting of the semiconductor layer sequence or border on electrical contact points. This enables electrical contacting of the semiconductor layer sequence and thus of the semiconductor device via the respective anchoring structure.

According to at least one embodiment, the anchoring structure or all anchoring structures or a part of the anchoring structures is configured to accommodate at least one thread. The thread can, for example, be clamped in the anchoring structure or fixed in the anchoring structure with a fastener such as an adhesive or solder.

According to at least one embodiment, the anchoring structure is configured to attach the semiconductor device to and/or in a fabric. Electrical contacting is preferably achieved via at least one thread. This means that the thread which is intended to be fixed in at least one anchoring structure is preferably an electrical supply line.

In at least one embodiment, the radiation-emitting semiconductor device comprises a semiconductor layer sequence with an active zone for generating radiation and at least one carrier on which the semiconductor layer sequence is applied. The at least one carrier has at least one anchoring structure on a carrier underside facing away from the semiconductor layer sequence. The at least one anchoring structure comprises or adjoins electrical contact points, the electrical contact points being configured for making electrical contact with the semiconductor layer sequence and thus with the semiconductor device. The at least one anchoring structure is configured to receive at least one thread for electrical contacting by means of the at least one thread and preferably for fastening the semiconductor device to a fabric.

With previous light emitting diode chips it is difficult to mount them on fibers. In particular, light-emitting diode chips are glued onto fibers or mounted on intermediate carriers, which in turn are attached to the fibers. With the semiconductor device described here, an efficient and/or stable fastening, especially directly to fibers and/or threads, is possible, in particular due to the anchoring structure.

According to at least one embodiment, at least one anchoring structure, seen in cross-section, widens first in the direction away from the semiconductor layer sequence and then narrows again. The respective parts of the anchoring structure can be formed like a keyhole when viewed in cross-section.

According to at least one embodiment, the anchoring structure is open on one side facing away from the semiconductor layer sequence. This means that the anchoring structure is freely accessible from the side facing away from the semiconductor layer sequence. In particular, the electrical contact points are then freely accessible from the outside. Such anchoring structures allow a thread to be fixed efficiently.

According to at least one embodiment, at least one anchoring structure is closed on a side facing away from the semiconductor layer sequence. The anchoring structure, for example, has an arched cross-section. In other words, the anchoring structure can form a tunnel at least in sections or throughout, which optionally covers the electrical contact points.

According to at least one embodiment, at least one anchoring structure widens monotonously or strictly monotonously when viewed in cross-section away from the semiconductor layer sequence. For example, the anchoring structure has the shape of a V or a U when viewed in cross-section. The anchoring structure can also be semicircular or rectangular in cross-section.

According to at least one embodiment, at least two anchoring structures intersect, especially when viewed from above on the carrier underside. For example, a grid-shaped pattern is formed by the anchoring structures. The anchoring structures can cross at right angles or at other angles, for example, at comparatively flat angles of at least 20° or 30° and/or at most 60° or 50°.

According to at least one embodiment, at least two anchoring structures run side by side when viewed from above, in particular without intersecting and/or crossing. The anchoring structures can be aligned parallel to each other or have a comparatively small angle to each other, for example, an angle of at least 5° or 10° and/or of at most 30° or 15° or 5°.

According to at least one embodiment, at least one of the anchoring structures is curved in places or completely when viewed from above. The anchoring structure may have a continuous, constant curvature. Similarly, the anchoring structure may have different curvatures when viewed from above and may, for example, be meandering or sinusoidal and/or have several changes of direction. In particular, the anchoring structure is shaped as a wavy line with curve transitions or as a rectangular saw tooth or triangular saw tooth with sharp kinks.

According to at least one embodiment, at least one anchoring structure has two or more layers. The layers preferably follow each other in the direction away from the semiconductor layer sequence. A first layer is closer to the semiconductor layer sequence than a second layer. The two layers can be made of the same material or of different materials. For example, the layers are formed in one piece or are attached to each other by gluing or bonding. In the different layers, the anchoring structure shows at least in places a different course. For example, the first layer, which is closer to the semiconductor layer sequence, is wider and/or differently curved than the second layer, which is further away from the semiconductor layer sequence.

According to at least one embodiment, the carrier has one or more anchoring structures at each of two opposite end faces. The end faces are preferably oriented transversely, in particular perpendicularly or approximately perpendicularly to a main direction of extent of the semiconductor layer sequence. The carrier underside is preferably oriented parallel or approximately parallel to the semiconductor layer sequence.

According to at least one embodiment, the semiconductor device has two or more carriers. The two carriers can be located on either side of the semiconductor layer sequence so that it can be placed between the carriers.

According to at least one embodiment, both carriers have one or more anchoring structures on each side facing away from the semiconductor layer sequence. Such an arrangement allows the semiconductor layer sequence to be integrated within a fabric. Preferably at least one of the carriers is transparent to the radiation generated in the semiconductor layer sequence.

According to at least one embodiment, at least one of the anchoring structures is or are some of the anchoring structures or are all anchoring structures designed as a column and/or elevation. Thus, the anchoring structures can rise above the carrier underside in the direction away from the semiconductor layer sequence. The columns can be of a different material or of the same material as the remaining parts of the carrier.

According to at least one embodiment, the columns are made of an electrically conductive material in places or completely. For example, the columns are metal columns that are galvanically produced on an initial layer. The columns can have several areas or layers, so that in particular a part of the columns farthest from the semiconductor layer sequence is electrically insulating in order to avoid short circuits.

According to at least one embodiment, at least one anchoring structure is or are some of the anchoring structures or are all anchoring structures configured as trench. In particular, the trenches represent depressions in the carrier underside. The anchoring structures can have the same depths and/or widths or there can be anchoring structures with different depths and/or widths. The same applies to the columns.

According to at least one embodiment, the trenches or at least one of the trenches is electrically conductive at at least one deepest point. This deepest point may be formed by one of the electrical contact points. As an alternative to or in addition to a deepest point, the trenches may be electrically conductive at a narrowest point. The narrowest point may also be designed as an electrical contact point.

According to at least one embodiment, the semiconductor device has several differently designed anchoring structures. Thus, different anchoring structures can be combined with each other. Alternatively, all the anchoring structures of the semiconductor device have the same geometry and/or electrical functionalization. Electrical functionalization means, for example, a functionalization as an electrode, whereby a distinction is not necessarily made between functionalization as an anode or cathode.

According to at least one embodiment, the semiconductor device has one or more sensors. For example, the at least one sensor is a sensor for temperature or pressure or brightness. Using appropriate sensors, it is possible, for example, to detect a pulse of a wearer of the fabric. Furthermore, semiconductor layer sequences may be present which emit infrared radiation, which is set up for detection with a sensor of the semiconductor device, especially after reflection on the skin of a user of the fabric.

According to at least one embodiment, the semiconductor device comprises sequences of semiconductor layers emitting different colors and/or semiconductor chips emitting different colors, in particular LED chips. There may also be multiple semiconductor layer sequences and/or semiconductor chips that produce light of the same color. For example, the semiconductor device is an RGB element that is capable of independently generating red, green and blue light.

According to at least one embodiment, the semiconductor device comprises one or more electronic units. The at least one electronic unit, for example, is an integrated circuit, IC for short, for instance an ASIC. With an electronic unit, components of the semiconductor device emitting different colors can be controlled independently of each other. Furthermore, addressing and/or control of the semiconductor device is possible via the electronics unit. The electronic unit is based, for example, on silicon. The electronic unit contains in particular constant current sources, voltage sources, transistors, switches, memory components and/or registers.

The electronic unit is particularly preferably formed by the carrier, which is in particular a silicon carrier or a silicon chip.

Further embodiments provide a fabric. The fabric comprises one or more radiation-emitting semiconductor devices as described in conjunction with one or more of the above embodiments. Features of the fabric are therefore also disclosed for the semiconductor devices and vice versa.

According to at least one embodiment, the fabric comprises one or more threads. The at least one thread is connected to the semiconductor device, in particular firmly connected. This means that the semiconductor device preferably does not detach itself from the thread when the fabric is used as intended.

According to at least one embodiment, the semiconductor device is electrically connected via at least one thread. A current is thus applied to the semiconductor device via the at least one thread.

According to at least one embodiment, the fabric contains several fibers. The fibers can be conventional tissue fibers, such as wool, cotton or synthetic fibers. In particular, the fibers and at least one thread are interwoven to form the tissue. Alternatively, the threads can be attached to or on the fibers, for example, by gluing or welding or caulking. It is also possible for the threads and fibers to be woven together so that the threads and fibers can form one or more common cords. The fibers can be electrically insulating. In particular, the fibers form the basis of the fabric.

It is possible that a mechanical integration of the semiconductor device takes place via the fibers, whereas an electrical integration takes place via the threads. The threads can also be used for the mechanical and electrical integration of the semiconductor device into the fabric and the integration of the threads into the fabric takes place via the fibers.

According to at least one embodiment, the semiconductor device is firmly attached to the tissue and/or in the tissue. This makes it possible to build up a luminous tissue that emits light via electroluminescence.

In at least one embodiment, the fabric comprises at least one radiation-emitting semiconductor device and at least one thread which is firmly connected to the semiconductor device and via which the semiconductor device is electrically connected. Several fibers are interwoven with the at least one thread to form a tissue or integrated into the tissue, so that the semiconductor device is firmly attached to the tissue or in the tissue.

According to at least one embodiment, the at least one thread is or the threads are electrically conductively connected to the electrical contact points of the semiconductor device by means of bonding, clamping, soldering and/or welding.

According to at least one embodiment, the thread and/or fibers have one or more electrically conductive coatings applied to a core material. There may also be an outer coating on the thread and/or fibers which partially covers the conductive coating. It is possible that the electrically conductive coating is partially removed from the core material.

According to at least one embodiment, the thread and/or fibers have conductive filaments, for instance of silver or carbon such as carbon nanotubes. The filaments may be attached to a surface of the thread and/or fibers and may be alternatively or additionally twisted in the thread and/or fibers. This means that the thread may have one or more filaments of an electrically conductive material which are preferably twisted together with an approximately thread-shaped base material, the base material being preferably electrically insulating and/or of conventional textile fibers. In the case of twisting of the filaments with the base material, which in turn may be composed of electrically insulating filaments, it is possible that the electrically conducting filaments are exposed in places on the surface of the thread and/or fibers. An average diameter of the electrically conductive and/or electrically insulating filaments is preferably at most 10% or 2% or 0.5% of an average diameter of the associated thread and/or fibers.

According to at least one embodiment, the thread has an average diameter of at least 5 µm or 10 µm. Alternatively or additionally, the mean diameter is not more than 50 µm or 30 µm. In particular, the thread is mechanically flexible so that the thread does not result in any or no significant change in the mechanical properties of the tissue formed essentially from the fibers. In particular, an average thickness of the semiconductor layer sequence and/or the semiconductor device may be smaller than the average diameter of the thread. It is possible that an average diameter of the fibers is equal to the average diameter of the thread, for example, with a tolerance of at most a factor of 2 or 1.5 or 1.2. Alternatively, the thread and the fibers may have significantly different diameters.

According to at least one embodiment, the at least one thread, seen in cross-section, lies completely within the at least one associated anchoring structure. Alternatively, it is possible for the thread to protrude from the anchoring structure when viewed in cross-section, for example, to a maximum of 10% or 20% or 40% of the mean diameter of the thread at the anchoring structure.

Such fabrics can be used, for example, for safety clothing such as firefighters and/or police and/or rescue services. Such fabrics can also be used by road users such as cyclists or pedestrians, for example, as wristbands, fitness bands or safety strips. They can also be used in the fashion sector. It can also be used, for example, to light bags, for instance in clothing.

BRIEF DESCRIPTION OF THE DRAWINGS

In the following, a semiconductor device described here and a fabric described here are explained in more detail with reference to the drawing on the basis of exemplary embodiments. The same reference signs indicate the same elements in the individual figures. However, no true-to-scale references are shown; rather, individual elements may be exaggeratedly large for a better understanding.

In the Figures:

FIGS. 1A, 2 to 5 and 11A show schematic sections of exemplary embodiments of semiconductor devices;

FIGS. 1B, 6 to 10, 11B, 12 and 13 show schematic top views of exemplary embodiments of semiconductor devices;

FIGS. 15A to 18 show schematic sectional representations of exemplary embodiments of fabrics;

FIG. 19A shows a schematic sectional view of a thread for exemplary embodiments of fabrics;

FIG. 19B shows a schematic side view of a thread for exemplary embodiments of fabrics.

DETAILED DESCRIPTION OF ILLUSTRATIVE EMBODIMENTS

Figure 1A:
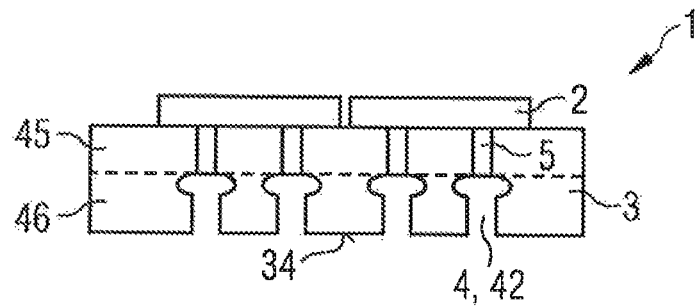

FIG. 1 illustrates an example of a radiation-emitting semiconductor device 1. The semiconductor device 1 comprises a carrier 3. Several semiconductor layer sequences 2 are applied to the carrier 3, in particular in the form of light emitting diode chips such as thin-film LEDs. At the semiconductor layer sequences 2 there are electrical contact points 5 for electrical contacting.

The contact points 5 adjoin anchoring structures 4 in the direction of a carrier underside 34. Seen in cross-section, the anchoring structures 4 are keyhole-shaped. Thus, the anchoring structures 4 have a first layer 45 closer to the semiconductor layer sequences 2, which have oval-shaped openings seen in cross-section. Furthermore, a second layer 46 is present directly on the carrier underside 34, which comprises rectangular openings as seen in cross-section. The openings in the two layers 45, 46 are placed centrally one above the other.

The two layers 45, 46 form straight trenches 42 which extend parallel to each other along the carrier 3. Thus the trenches 42 have a larger width in the region of the first layer 45 than in the region of the second layer 46. Using such a configuration of the anchoring structures 4 it is possible to clamp and fix a thread, not drawn, in the region of the first layer 45.

The semiconductor layer sequences 2 are in particular thin-film light emitting diode chips that are free of a growth substrate. For example, the semiconductor layer sequences 2 are based on the AlInGaN material system. The semiconductor layer sequences 2 can have a contiguous, homogeneous luminous surface or be subdivided into individual image areas or pixels. The individual pixels or semiconductor layer sequences 2 as a whole can be configured to emit monochrome light, such as blue or green or red light. It is also possible that different color emitting pixels or semiconductor layer sequences 2 are present. In order to generate light of different colors, in particular white light, 2 luminescent materials not drawn can be applied to the semiconductor layer sequences throughout or in certain areas.

The carrier 3, for example, is a silicon carrier with vias. In particular, the electrical contact points 5 are formed by the vias. All electrical contacts of the semiconductor layer sequences 2 can face the carrier 3. The carrier 3 can also be made of a glass, a ceramic or a plastic or a composite material therefrom, in particular the carrier 3 is a cast or molded or injection-molded body with at least one plastic and/or with electrical structures such as for conductor tracks or through-holes.

The trenches 42 of the anchoring structures 4 are formed, for example, by etching the carrier 3. If the semiconductor layer sequences 2 are configured to emit different colors, one or two of the trenches 42 and the anchoring structures 4 may be provided for each polarity and/or color. As in all other exemplary embodiments, it is possible that the anchoring structures 4 are provided at least in places with a non-drawn roughening in order to achieve a better clamping effect on the non-drawn thread.

Furthermore, it is possible that on the carrier 3 and/or on the semiconductor layer sequences 2, undrawn further components such as phosphors or optics are attached for beam shaping. This is also possible in all other exemplary embodiments.

The carrier 3, in particular made of silicon, can be polished after assembly of the semiconductor layer sequence 2 and to generate the through-holes, also referred to as Through Silicon Via, and subsequently thickened again with a further silicon wafer or carrier wafer. The anchoring structures 4 are then etched into the second wafer of the carrier, corresponding to the second layer 46 or the first and second layers 45, 46 taken together, from the carrier underside 34 until the contact points 5 are exposed.

Alternatively, such structuring can also take place in the second disk before it is applied, so that only by bringing the two disks together the openings lying on top of each other arise. Several structures and/or holes with different depths or in different depths can also be created in a corresponding manner, which can be used in particular with a crossing course of anchoring structures 4. As an alternative to a silicon or silicon-based carrier 3, another electrically insulating material can also be used, such as sapphire or a glass or a ceramic or a plastic.

Figure 2:
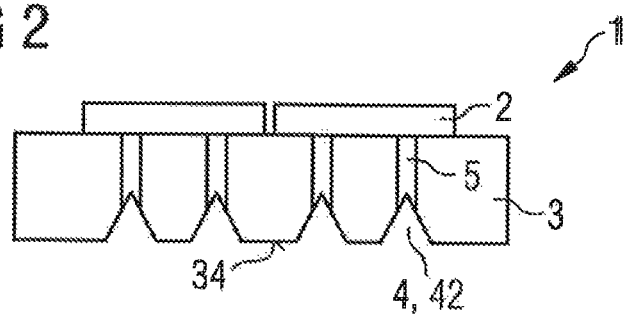

In the exemplary embodiment shown in FIG. 2, the trenches 42 have a V-shaped cross-section. The V-shape can reach into the electrical contact points 5. Thus a lowest point of the trenches 42 is formed by the contact points 5. In the direction away from the semiconductor layer sequences 2, the width of the trenches 42 increases strictly monotonously.

Figure 3:
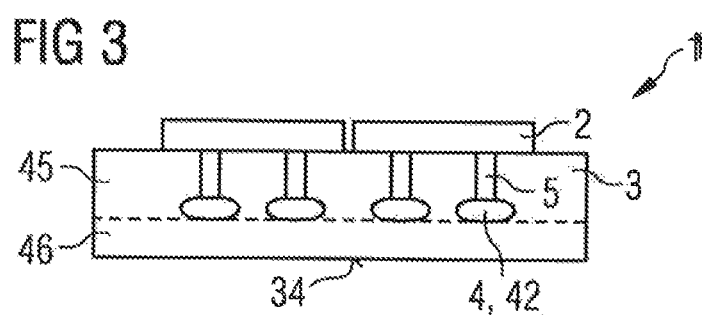

In the exemplary embodiment shown in FIG. 3, the anchoring structures 4 are formed by oval openings in cross-section. These openings are located in the first layer 45 directly at the contact points 5. The second layer 46 extends continuously over these openings, so that the carrier underside 34 can form a continuous, closed surface. Thus the anchoring structures 4, seen in cross-section, represent gate-like openings through which a fiber and/or a thread can run, similar to a needle eye or tunnel. The areas of carrier 3 remaining in the first layer 45 can also only be closed by applying the second layer 46 after the insertion of a thread and/or a fiber. The gate-like structures and the second layer 46 can therefore, if necessary, only be present in the finished yarn and/or tissue after the semiconductor device 1 has been attached.

Figure 4:
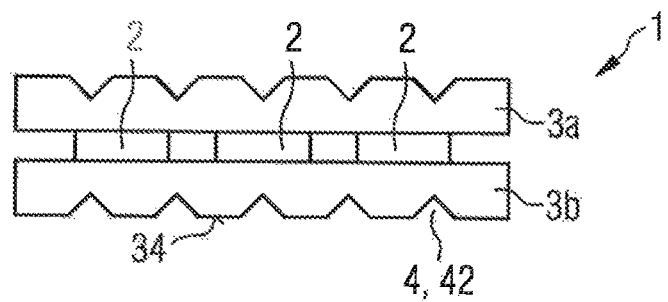

In the exemplary embodiment shown in FIG. 4, the semiconductor device 1 has a first carrier 3a and a second carrier 3b between which the semiconductor layer sequences 2 are located. Each of the carriers 3a, 3b is provided with the anchoring structures 4. Thus, the anchoring structures 4 are placed on opposite sides of the semiconductor layer sequence 2. Each of the sides is preferentially configured for a specific polarity. For example, the carrier 3a serves as the anode-side contact and the carrier 3b as the cathode-side contact.

In order to simplify contacting, several of the anchoring structures 4 can be present per polarity to simplify the insertion of the semiconductor device 1 into a fabric. Several anchoring structures 4 can also be provided for each data line. The same applies to all other exemplary embodiments.

Figure 5:
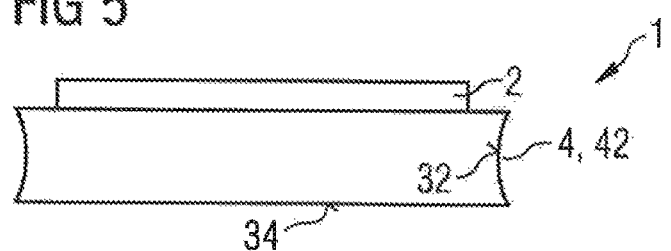

In the exemplary embodiment of FIG. 5, carrier 3 has the anchoring structures 4 on each of two opposite end faces 32. This allows the semiconductor device 1 to be clamped between two tensioned threads, not drawn. The electrical contact points not drawn in FIG. 5 are preferably located in the anchoring structures 4. Seen in cross-section, the anchoring structures 4 are, for example, arc-shaped or semicircular. The anchoring structures 4 can only partially or completely form the end faces 32.

Figure 6:
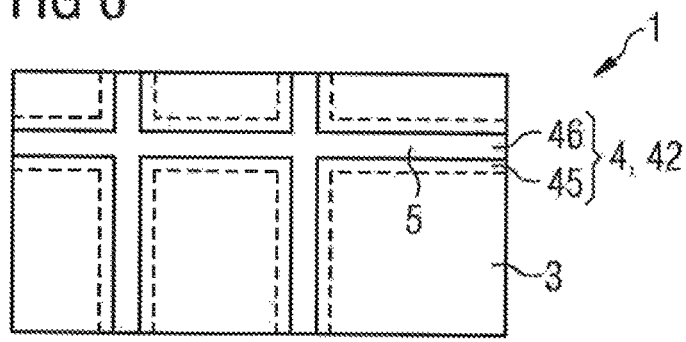

A semiconductor device 1 in which the anchoring structures 4 intersect is illustrated in FIG. 6. Such anchoring structures 4 crossing at a right angle can be constructed in the two layers 45, 46, analogous to FIG. 1A. As in all other exemplary embodiments, layers 45 and/or 46 may be repeated several times, especially alternately.

Figure 7:
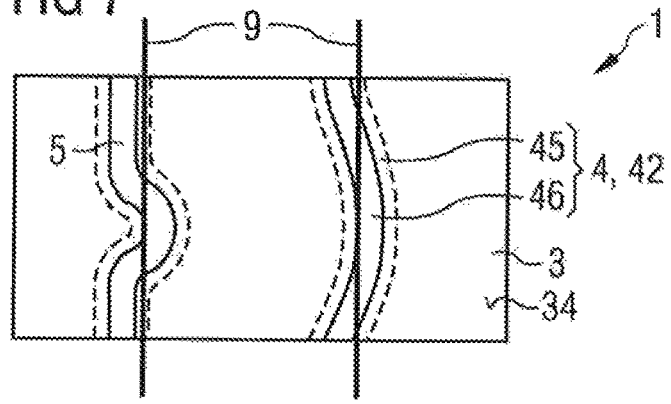

According to FIG. 7, the trenches 42 for the anchoring structures 4 have different degrees of curvature. In the example on the left in FIG. 7, there is a comparatively strong curvature in the middle between two straight sections.

Figure 1B:
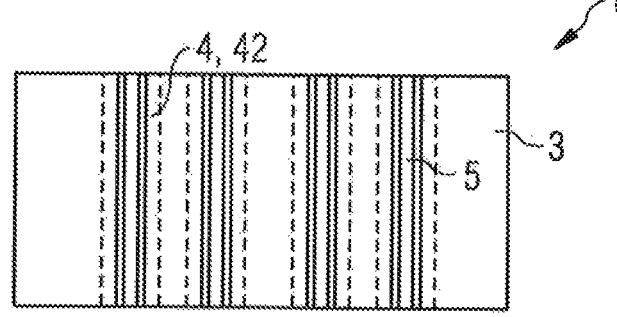

The example on the right in FIG. 7 shows a continuous, constant curvature. Again, the anchoring elements 4 can be shaped in cross-section as shown in FIG. 1A.

FIG. 7 also illustrates schematic threads 9 for electrical contacting. By dividing the anchoring structures 4 into layers 45, 46, it is possible that the threads 9 can run in a straight line through the first layer 45 in particular. Seen from above, the threads 9 are only exposed in sections. This means that from the second layer 46 the threads 9 are only partially accessible. In the direction perpendicular to the carrier underside 34, the threads 9 cannot easily be removed from the semiconductor device 1 in the tightened state. To insert the threads 9, however, they preferably follow the course of the second layer 46, so that the threads 9 are only anchored by tightening them.

Figure 8:
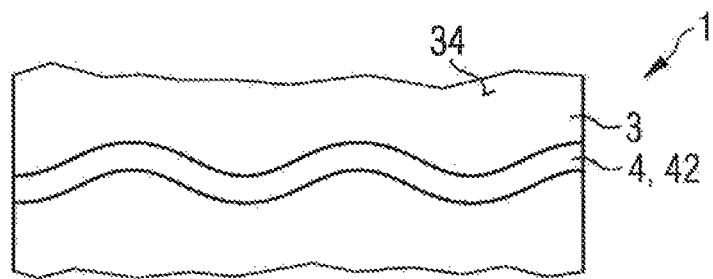

In the exemplary embodiment of FIG. 8, the anchoring structure 4 has a serpentine, meandering course when viewed from above. Again, the cross-sectional shape of the anchoring structures 4 can be used, as illustrated in FIG. 1A.

Figure 9:
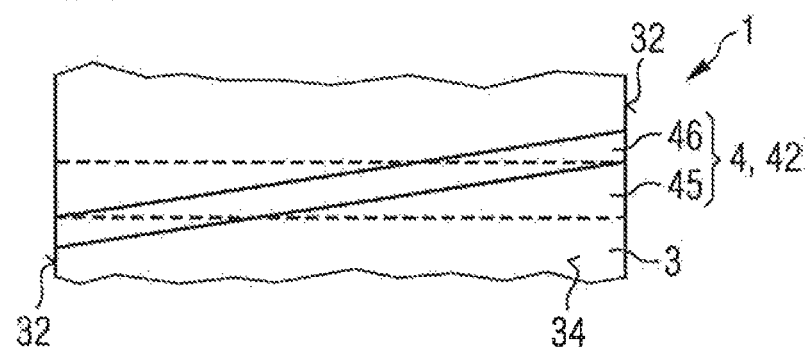

In the exemplary embodiment of FIG. 9, straight trenches are formed in the two layers 45 and 46. These two trenches in layers 45 and 46 can have the same width or different widths. However, the trenches in layers 45 and 46 are tilted towards each other. Thus the thread, not drawn in FIG. 9, is inserted, for example, along the second layer 46 and then tightened so that the thread is shifted to the first layer 45. The trench in the first layer 45 preferably has a smaller angle to the side surfaces of carrier 3 than the trench in the second layer 46. At the end faces 32 of the carrier 3 the two layers 45, 46 preferably overlap each other.

Figure 10:
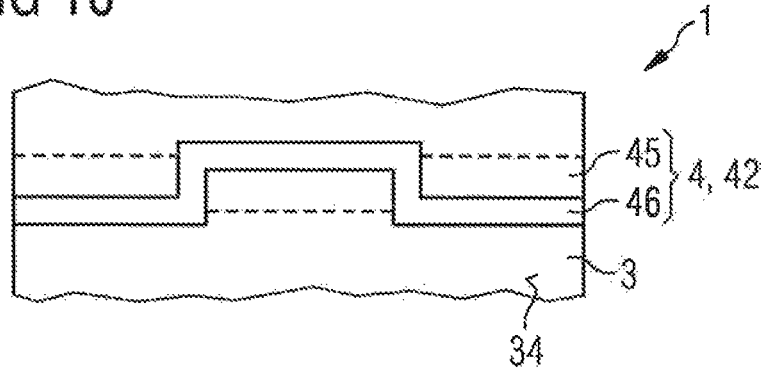

According to FIG. 10 the trench 42 in the second layer 46 shows a rectangular course in a middle area. On the other hand, the trench 42 in the first layer 45 is only present at the edge areas on the side into which trench 42 of the second layer 46 bends. Furthermore, trench 42 is present in the first layer 45 in the rectangular cutout in the middle of trench 42 of the second layer 46. Again, the undrawn thread can be inserted along the trench 42 of the second layer 46 and fixed in the first layer 45 by tightening.

The top views of FIGS. 1B and 6 to 10 are drawn primarily for the anchoring structures of FIG. 1A. The anchoring structures 4 of FIG. 3 can be used in the same way. For the anchoring structures of FIG. 2, the same applies as for the second layer 46.

Furthermore, according to FIGS. 1 to 10, the anchoring structures 4 are formed by the trenches 42. In the same way, the anchoring structures 4 can be configured as columns 41, see FIG. 11A. The columns 41, for example, are truncated conical in shape and, seen from above, see FIG. 11B, regularly arranged, for example, in a hexagonal or square pattern. Alternatively, the columns 41, as well as the trenches 42, may be arranged irregularly and/or randomly, for example, by a self-organized manufacturing process, especially without lithographic step and/or mask step.

What has been said in connection with FIGS. 1 to 10 on trenches 42 applies equally to columns 41, especially with regard to their cross-sectional shape and also with regard to their plan view of the carrier underside 34.

Columns 41 can also be formed from the two layers 45, 46, see FIG. 11A. For example, the first layer 45 represents a basis for growth on which the thicker second layer 46 is galvanically produced, for example.

Columns 41 can thus be produced by structured electrochemical deposition. For this purpose, for example, the desired structure is formed inverted in photoresist on a continuous electrically conductive layer as a plating base. In the developed areas freed from the photoresist, the columns 41 or alternatively structures or negative structures for the trenches 42, for example, can be deposited, for instance galvanically. After the photoresist and plating base have been removed in the vicinity of columns 41 or trenches 42, columns 41 or trenches 42 are ready for connection to the threads.

According to FIG. 12, the columns 41 are L-shaped when viewed from above, with four of the columns 41 preferably forming a cross-shaped structure. Columns 41 preferably have the two layers 45, 46, analogous to FIG. 1A.

According to FIG. 13, first columns 4a and second columns 4b are present. For example, the first columns 4a are assigned to contact points 5 and are rectangular when viewed from above. The circular anchoring structures 4b seen from above can be used for anchoring with other fibers.

Figure 14:
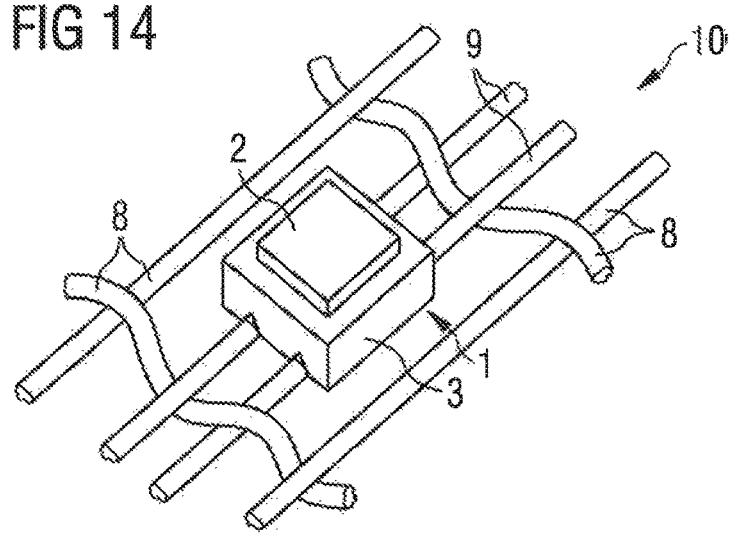
FIG. 14 shows a schematic perspective representation of an exemplary embodiment of a fabric.

FIG. 14 illustrates a fabric 10 with a semiconductor device 1, for example, according to FIG. 2. The semiconductor device 1 is electrically contacted via the threads 9. The threads 9 are woven into fibers 8, which run on all sides of the semiconductor device 1 when viewed from above. Thus, the semiconductor device 1 can be easily integrated into a tissue. The tissue is essentially based on fibers 8.

In order not to impair the mobility or stiffness of the fabric 10, the threads 9 preferably have a similar thickness as the fibers 8. For example, the lateral dimensions of the semiconductor device 1 are at least 0.1 mm and/or at most 1 mm. The threads 9 can be connected to a control unit and/or a battery. Optionally it is possible that the semiconductor device 1 has an undrawn sensor, for example, for temperature, pressure or radiation.

Deviating from the illustration in FIG. 14, it is possible, as in all exemplary embodiments, that the fibers 8 are significantly thicker than the thread 9. Thus, the fibers 8, in addition to the semiconductor device 1, can be as thick as or thicker than the location where the semiconductor device 1 is placed. This allows the semiconductor device 1 to be unobtrusively integrated into the tissue.

According to FIG. 14, the threads 9 have a constant, constant diameter. Deviating from this, it is possible that the threads 9 are significantly thicker in areas adjacent to the semiconductor device 1. This allows the semiconductor device 1 to be better integrated into the tissue and/or the placement of the semiconductor device 1 along the threads 9 can be simplified.

Figure 15A:
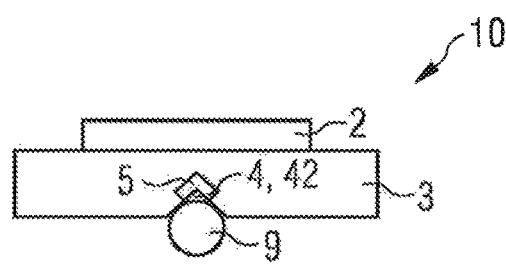
Figure 15B:
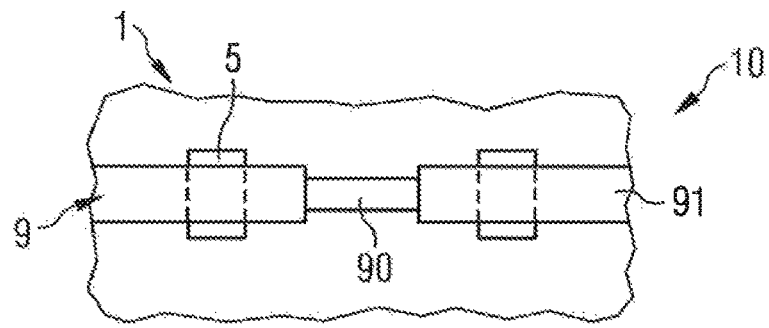

FIG. 15 illustrates that the semiconductor device 1 has only a single anchoring structure 4 that extends longitudinally through carrier 3. The contact points 5 are located on the anchoring structure 4. The thread 9 has an electrically insulating core material 90, which is provided with an electrically conductive coating 91. The electrically conductive coating 91 is removed in places between the contact points 5. This means that a single thread 9 is sufficient to electrically contact the semiconductor device 1 with two poles.

Figure 16:
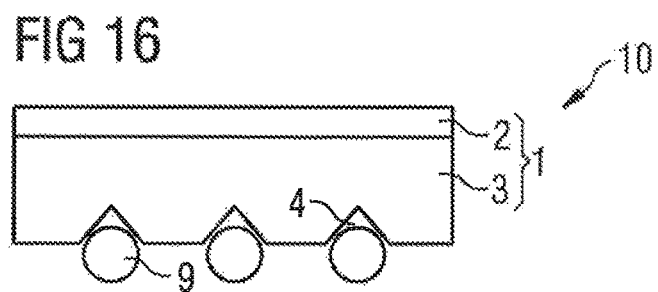

According to FIG. 16, several of the threads 9 are present, as are several of the anchoring elements 4. A 1:1 assignment is preferred between the threads 9 and the anchoring elements 4.

In FIG. 17 it is shown that the anchoring elements 4 are rectangular in cross-section. Only a part of the anchoring elements 4 is provided with the threads 9 for contacting the semiconductor device 1.

In the exemplary embodiment of FIG. 18, several of the anchoring structures 4 are present. All anchoring structures 4 are provided either with the threads 9 or with the fibers 8. This allows a particularly firm integration of the semiconductor device 1 into the fabric 10.

The threads 9 and the fibers 8 are either simply clamped or fixed in the anchoring structures 4 with an adhesive such as a silver conductive adhesive. Furthermore, the threads 9 and/or the fibers 8 can be soldered or welded on.

The fibers 8 and/or the threads 9 are based on a wool material or a synthetic fiber, for example. In particular, the core material 90, see the sectional view in FIG. 19A and the side view in FIG. 19B, is made of plastic. The core material 90 is preferably coated all around with the electrically conductive coating 91. The 91 coating, for example, is made of silver or aluminum.

Furthermore, an outer coating 92 can be present on the outside around the conductive coating 91. Just like the conductive coating 91, the outer coating 92 can be removed in places, for example, by laser irradiation.

The outer coating 92 is, for example, a silicone, an epoxy, an acrylic resin or a transparent, semitransparent, clear, whitish or colored overlay. The threads 9 and/or the fibers 8 can thus be efficiently attached to the semiconductor device 1 and, due to their colored design, blend unobtrusively into the fabric without creating a significant contrast to other areas of the tissue.

Figure 20:
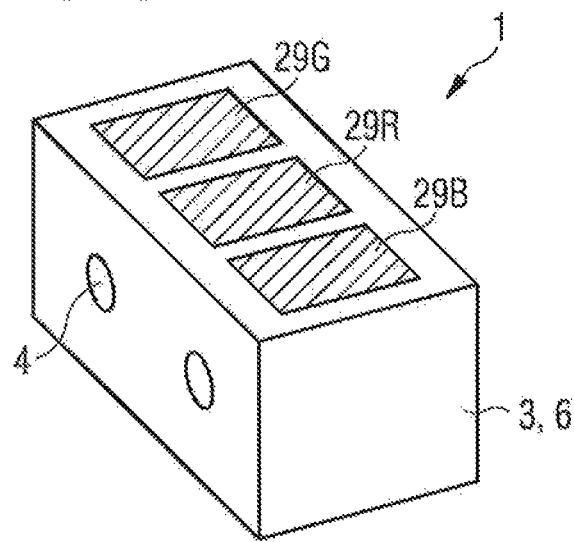
FIGS. 20 and 21 show schematic perspective representations of exemplary embodiments of semiconductor devices.

In the exemplary embodiment shown in FIG. 20, the semiconductor device 1 comprises several LED chips 29R, 29G, 29B, which are preferably configured to generate red, green and blue light. The LED chips 29R, 29G, 29B, which preferably each have their own undrawn semiconductor layer sequence 2, are mounted on the carrier 3 or integrated in the carrier 3.

The carrier 3 is an electronic unit 6, for example, an ASIC based on silicon. ASIC stands for application-specific integrated circuit.

The carrier 3 contains the, e.g., hole-shaped anchoring structures 4 for mounting on fibers.

Several LED chips of the same or different colors can be mounted.

Figure 21:
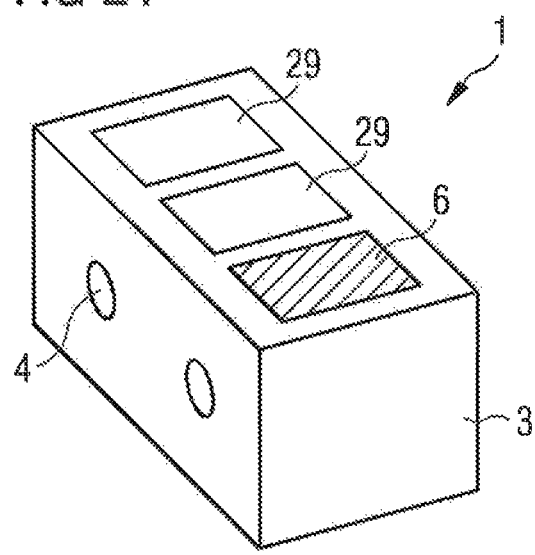

In FIG. 21 it is shown that the LED chips 29 and the electronics unit 6 are integrated in the carrier 3 or attached to the carrier 3. In this case the carrier 3 is a potting body or contains a potting body. In such a potting body, non-drawn electrical contact points can be integrated.

The electronic unit 6 of FIG. 20 or 21 is preferably an ASIC that contains, for example, an address of the LED chips 29 and the semiconductor device 1, so that individual LED chips 29 can be specifically switched on.

As an alternative to several separate LED chips 29, it is possible to use a preferably structured semiconductor layer sequence 2 in combination with one or more locally applied phosphors to generate different colored light. Individual areas of semiconductor layer sequence 2 for generating different colors can preferably be electronically controlled independently of each other.

Unless otherwise indicated, the components shown in the figures follow each other directly in the order indicated. Layers not touching each other in the figures are spaced from each other. If lines are drawn parallel to each other, the corresponding surfaces are also aligned parallel to each other.

The invention described here is not restricted to the exemplary embodiments by the description on the basis of said exemplary embodiments. Rather, the invention encompasses any new feature and also any combination of features which in particular comprises any combination of features in the patent claims and any combination of features in the exemplary embodiments, even if this feature or this combination itself is not explicitly specified in the patent claims or exemplary embodiments.

The invention claimed is:

1. A textile comprising:
   at least one radiation-emitting semiconductor device;
   at least one thread firmly connected to the semiconductor device via which the semiconductor device is electrically connected; and
   a plurality of fibers interwoven with each other and with the at least one thread to form a tissue so that the semiconductor device is firmly attached to the tissue or in the tissue,
   wherein the semiconductor device comprises a semiconductor layer sequence having an active region configured to generate radiation,
   wherein the semiconductor device comprises at least one carrier on which the semiconductor layer sequence is located,
   wherein the at least one carrier has at least one anchoring structure on a carrier underside facing away from the semiconductor layer sequence,
   wherein the at least one anchoring structure comprises electrical contact points for electrically contacting the semiconductor layer sequence,
   wherein the at least one anchoring structure is configured to receive the at least one thread for fastening the semiconductor device to the tissue or in the tissue,
   wherein the at least one anchoring structure is curved when viewed from above, and
   wherein the at least one anchoring structure does not extend completely through the carrier in a direction perpendicular to the carrier underside.

2. The textile according to claim 1, wherein the at least one thread is electrically conductively connected to the electrical contact points by gluing, clamping, soldering, caulking and/or welding.

3. The textile according to claim 1,
   wherein the thread comprises an electrically conductive coating on a core material, or the thread comprises a plurality of filaments of an electrically conductive material twisted together with a thread-shaped base material, and
   wherein an average diameter of the thread is between 5 µm and 50 µm inclusive such that the average diameter is greater than an average thickness of the semiconductor layer sequence.

4. The textile according to claim 1, wherein the at least one thread, viewed in cross-section, lies completely within the at least one associated anchoring structure.

5. The textile according to claim 1, wherein the semiconductor layer sequence comprises a thin-film light-emitting diode chip, which is free of a growth substrate for the semiconductor layer sequence.

6. A radiation-emitting semiconductor device comprising:
   a semiconductor layer sequence having an active region configured to generate radiation; and
   at least one carrier on which the semiconductor layer sequence is arranged,
   wherein the at least one carrier has at least one anchoring structure on a carrier underside facing away from the semiconductor layer sequence,
   wherein the at least one anchoring structure comprises electrical contact points for electrically contacting the semiconductor layer sequence,
   wherein the at least one anchoring structure is configured to receive at least one thread for fastening the semiconductor device to a fabric and for electrically contacting the at least one thread, wherein the at least one anchoring structure is curved when viewed from above, and wherein the at least one anchoring structure does not extend completely through the carrier in a direction perpendicular to the carrier underside.

7. The semiconductor device according to claim 6, wherein at least two anchoring structures extend next to one another without intersecting when viewed from above.

8. The semiconductor device according to claim 6, wherein the semiconductor device comprises semiconductor chips.

9. The semiconductor device according to claim 6, wherein the semiconductor device comprises at least one electronic unit.

10. The semiconductor device according to claim 6,
wherein the at least one anchoring structure, viewed in cross-section, widens first in a direction away from the semiconductor layer sequence and then narrows, and
wherein the at least one anchoring structure is open on the carrier underside.

11. The semiconductor device according to claim 6,
wherein the at least one anchoring structure, viewed in cross-section, widens first in a direction away from the semiconductor layer sequence and then narrows, and
wherein the at least one anchoring structure is closed on the carrier underside.

12. The semiconductor device according to claim 6, wherein the at least one anchoring structure widens strictly monotonously in a direction away from the semiconductor layer sequence when viewed in cross-section.

13. The semiconductor device according to claim 6, wherein at least two anchoring structures intersect when viewed from above.

14. The semiconductor device according to claim 6, wherein the at least one anchoring structure has a meandering shape when viewed from above and shows a plurality of changes in a direction.

15. The semiconductor device according to claim 6, wherein the at least one anchoring structure has two layers which, viewed from above, have at least locally a different course from one another.

16. The semiconductor device according to claim 6, wherein the carrier has the at least one anchoring structure at each of two opposite end faces.

17. The semiconductor device according to claim 6, wherein the semiconductor device comprises two carriers located on both sides of the semiconductor layer sequence, and wherein each of the two carriers has the at least one anchoring structure on sides facing away from the semiconductor layer sequence.

18. The semiconductor device according to claim 17,
wherein the at least one anchoring structure is a column which rises above the carrier underside, and
wherein the column is at least locally made of an electrically conductive material.

19. The semiconductor device according to claim 6,
wherein the at least one anchoring structure is a trench formed in the carrier underside, and
wherein the trench is electrically conductive at least at a deepest point.

20. The semiconductor device according to claim 6, wherein the semiconductor device comprises semiconductor layer sequences configured to emit different colors.

* * * * *